United States Patent [19]
Ristic

[11] Patent Number: 5,393,678
[45] Date of Patent: Feb. 28, 1995

[54] METHOD FOR MAKING COLLECTOR ARRANGEMENT FOR MAGNETOTRANSISTOR

[75] Inventor: Ljubisa Ristic, Paradise Valley, Ariz.

[73] Assignee: Motorola, Inc., Schaumburg, Ill.

[21] Appl. No.: 227,745

[22] Filed: May 18, 1994

Related U.S. Application Data

[62] Division of Ser. No. 69,802, Jun. 1, 1993, Pat. No. 5,323,050.

[51] Int. Cl.$^6$ .......................................... H01L 21/265
[52] U.S. Cl. ....................................... 437/31; 437/32; 324/252
[58] Field of Search ................ 324/252; 257/421, 422, 257/423, 424, 425, 426, 427; 437/31, 32

[56] References Cited

U.S. PATENT DOCUMENTS

| | | | |
|---|---|---|---|
| 4,339,715 | 7/1982 | Bloodworth et al. | 257/422 |
| 4,683,429 | 7/1987 | Popovic | 324/252 |
| 4,700,211 | 10/1987 | Popovic et al. | |
| 4,829,352 | 5/1989 | Popovic | 324/252 |
| 4,939,563 | 7/1990 | Fang et al. | |
| 4,978,630 | 12/1990 | Kim | 437/32 |
| 5,099,298 | 3/1992 | Nakamura et al. | |
| 5,179,429 | 1/1993 | Ristic. | |

OTHER PUBLICATIONS

LJ. Ristic et al, "3-D Magnetic Field Sensor Realized as a Lateral Magnetotransistor in CMOS Technology," Sensors and Actuators, A21–A23 (1990) 770–775.

Lj. Ristic et al, "2-D Integrated Magnetic Filed Sensor in CMOS Technology," Bipolar Circuits and Technology Meeting, 1989, p. 701.

*Primary Examiner*—Olik Chaudhuri
*Assistant Examiner*—Brian K. Dutton
*Attorney, Agent, or Firm*—Rennie William Dover

[57] ABSTRACT

A collector arrangement for a magnetotransistor (10, 25, 30) and a method for making the magnetotransistor (10, 25, 30). A portion of a semiconductor substrate (11) is doped to form a base region (13). The base region is doped to form an emitter region (16, 26, 36) and a collector region (17, 27, 37) such that the collector region (17, 27, 37) surrounds and is spaced apart from the emitter region (16, 26, 36). Collector contacts ($C_1$-$C_8$ and $C_5'$-$C_8'$, $C_{13}$-$C_{16}$) are symmetrically formed in the collector region (17, 27, 37). In a three-dimensional magnetotransistor (10, 25) the collector contacts include split-collector contacts ($C_5$-$C_8$ and $C_5'$-$C_8'$).

20 Claims, 5 Drawing Sheets

10 *Fig. 3*

METHOD FOR MAKING COLLECTOR ARRANGEMENT FOR MAGNETOTRANSISTOR

This is a division of application Ser. No. 08/069,802, filed Jun. 1, 1993, now U.S. Pat. No. 5,323,050.

BACKGROUND OF THE INVENTION

The present invention relates, in general, to magnetotransistors, and more particularly, to a collector arrangement for magnetotransistors.

Magnetotransistors are magnetic field sensors that are commonly used to detect the presence and orientation of a magnetic field or more particularly a magnetic flux density. Typically, these sensors are semiconductor devices that include an injection region, a conduction region, and a collection region. Charge carriers, i.e., electrons or holes, are injected from the injection region into the conduction region and are subsequently collected in the collection region. An example of such a sensor is a lateral magnetotransistor having an emitter region, a base region, and a collector region, wherein the emitter region serves as the injection region, the base region serves as the conduction region, and the collector region serves as the collection region.

When a magnetic field is applied to the magnetotransistor, it exerts an electromagnetic force on the charge carriers. This force, commonly referred to as a Lorentz force, deflects the charge carriers traveling through the base region thereby creating an imbalance in the number of charge carriers collected by the collector region. In other words, the collector currents become imbalanced. This imbalance may be exploited to determine the strength and orientation of the magnetic flux density.

Two important types of magnetotransistors are two-dimensional (2D) magnetotransistors which detect the x and y directional components, $B_x$ and $B_y$, respectively, of the magnetic flux density and three-dimensional (3D) magnetotransistors which detect the x, y, and z directional components of the magnetic flux density, $B_x$, $B_y$, and $B_z$, respectively. A drawback of 2D and 3D magnetotransistors is that the noise signals associated with the currents in each collector are uncorrelated and may mask the imbalance in the collector current attributed to the magnetic flux density. Moreover, in 3D magnetotransistors there is a cross-sensitivity between the charge carrier flow in the y-direction and the $B_x$ component of the magnetic flux density, and between the charge carrier flow in the x-direction and $B_y$ component of the magnetic flux density.

Accordingly, it would be advantageous to have a magnetotransistor and a method for making the magnetotransistor that reduces the noise due to the uncorrelated collector currents. It would be of further advantage that the 3D magnetotransistor and the method for making the 3D magnetotransistor eliminate cross-sensitivity between the charge carrier flow in the y-direction and the $B_x$ component and between the charge carrier flow in the x-direction and the $B_y$ component.

SUMMARY OF THE INVENTION

Briefly stated, the present invention is a collector arrangement for a magnetotransistor and a method for making said magnetotransistor. In one aspect of the present invention a magnetotransistor comprises a semiconductor substrate of a first conductivity type which has a principal surface. A base region of a second conductivity type extends from the principal surface into the semiconductor substrate. An emitter region of the first conductivity type extends from the principal surface into the base region. An annularly shaped collector region of the first conductivity type laterally surrounds and is spaced apart from the emitter region, wherein the collector region extends from the principal surface into the base region. A base contact is formed on the principal surface of the base region, an emitter contact is formed on the principal surface of the emitter region, and a plurality of collector contacts are formed on the principal surface in the collector region, wherein a first and a second of the plurality of collector contacts are adjacent opposite sides of the emitter region, and a third and a fourth of the plurality of collector contacts are adjacent opposite sides of the emitter region. The sides adjacent the first and second collector contacts being different than the sides adjacent the third and fourth collector contacts.

Another aspect of the present invention is a method of forming the magnetotransistor.

DETAILED DESCRIPTION OF THE DRAWINGS

Figure 1:
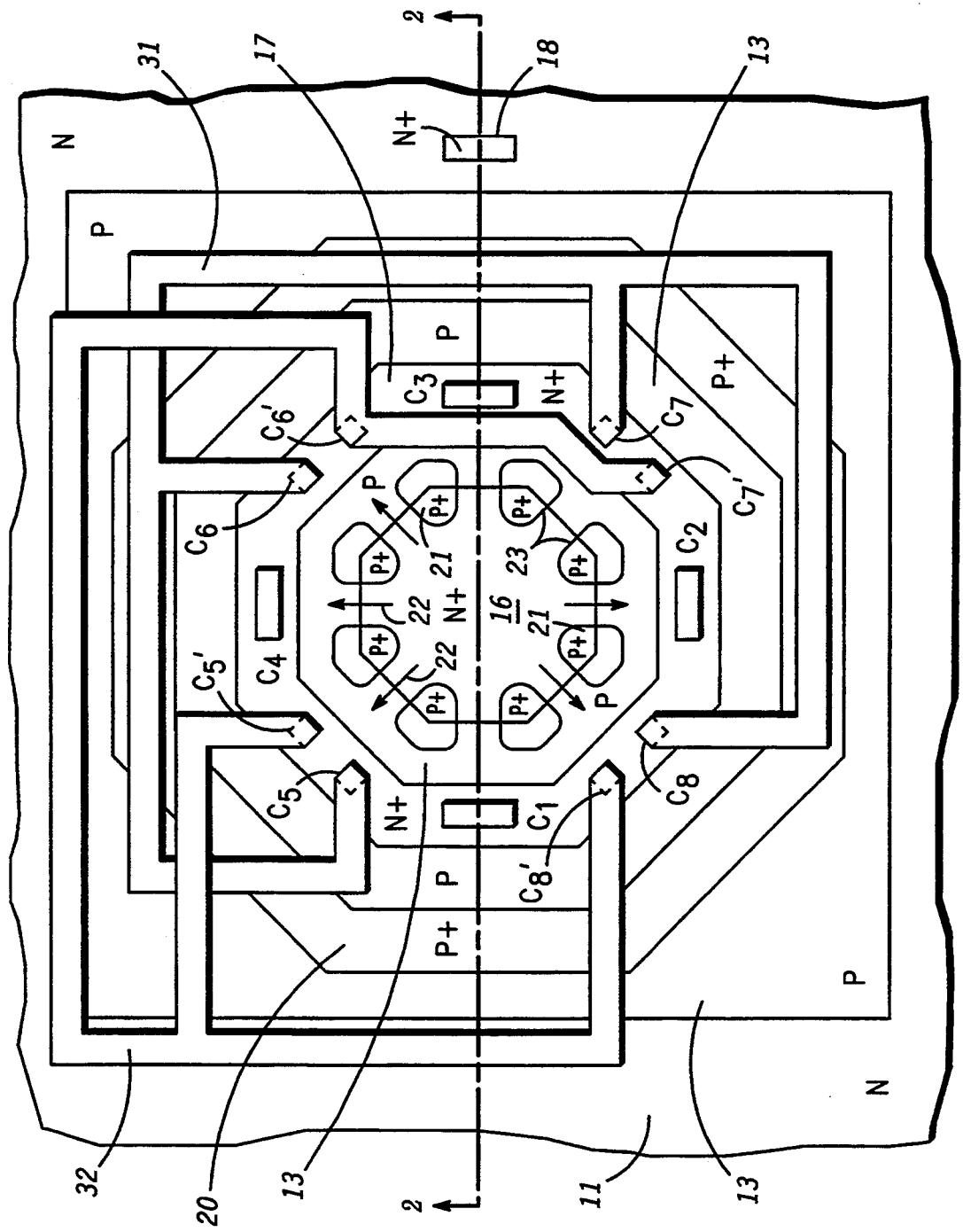
FIG. 1 illustrates a highly-enlarged plan view of one embodiment of a portion of a three-dimensional magnetic field sensor in accordance with the present invention.
Figure 2:
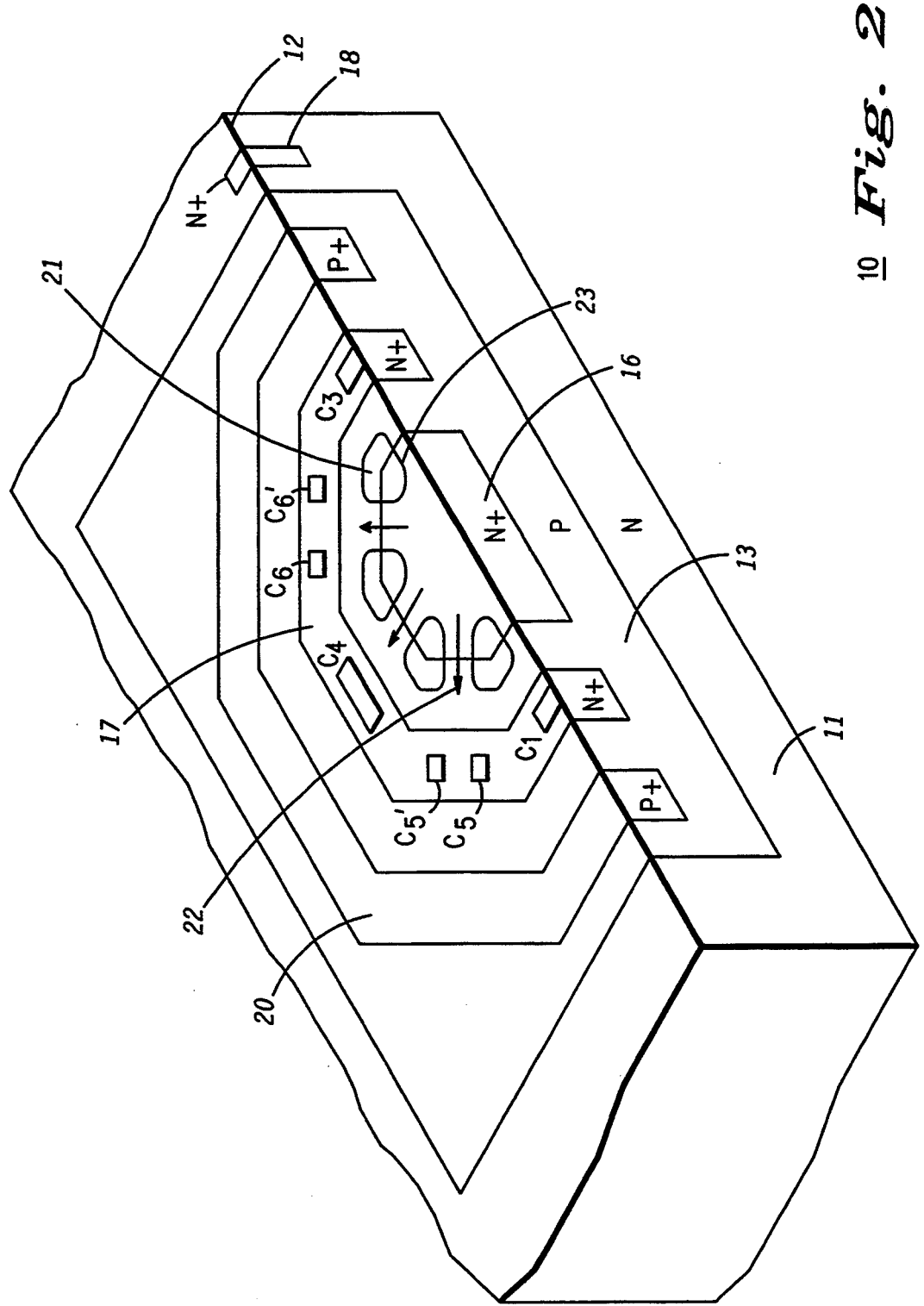
FIG. 2 illustrates a cross-sectional perspective view of the magnetic field sensor of FIG. 1.

FIG. 1 illustrates a highly-enlarged plan view of a first embodiment of a magnetic field sensor 10, whereas FIG. 2 illustrates a cross-sectional perspective view of magnetic field sensor 10 taken along section lines 2–2 of FIG. 1. For clarity, conductive traces 31 and 32 of FIG. 1 have been omitted from FIG. 2. Preferably, magnetic field sensor 10 is a lateral magnetotransistor comprising a lateral NPN transistor. Although the present invention is described in terms of an NPN transistor, it shall be understood that magnetic field sensor 10 may comprise a lateral PNP transistor. As those skilled in the art will recognize, the dopant types for a magnetic field sensor comprising a lateral PNP transistor will be opposite those described hereinafter. Further, the notation "N−" refers to N type dopant or impurity material concentrations less than about $10^{15}$ atoms/cm$^3$, the notation "N+" refers to N type dopant concentrations greater than about $10^{18}$ atoms/cm$^3$. Likewise, the notation "P−" refers to P type dopant or impurity material concentrations less than about $10^{15}$ atoms/cm$^3$, the notation "P+" refers to P type dopant concentrations greater than about $10^{18}$ atoms/cm$^3$.

Magnetotransistor 10 comprises a semiconductor substrate 11 which is doped with an N type dopant and has a principal or major surface 12. Preferably, semiconductor substrate 11 is silicon having a <100> crystal orientation and doped with phosphorus in a concentration of $10^{15}$ atoms/cm$^3$. Other suitable N type dopants include arsenic and antimony. A base region 13 is formed in a portion of semiconductor substrate 11 by doping semiconductor substrate 11 with a P type dopant. By way of example, base region 13 extends from principal surface 12 approximately 4 micrometers ($\mu$m) into semiconductor substrate 11. Preferably, the P type dopant is boron having a concentration of $10^{16}$ atoms/cm$^3$.

An emitter region 16 is formed within base region 13 by doping a first portion of base region 13 with an N type dopant such as phosphorus. In a first embodiment, emitter region 16 is an annular shaped octagonal structure having eight sides and eight corners. Emitter region 16 is an N+ region having, for example, a dopant concentration of $10^{20}$ atoms/cm$^3$. In addition, a collector region 17 is formed within base region 13 by doping a second portion of base region 13 with the N type dopant having a concentration of $10^{20}$ atoms/cm$^3$. Collector region 17 is an annularly shaped N+ region that conforms to the shape of emitter region 16, and laterally surrounds and is spaced apart from emitter region 16. For a base region 13 having a junction depth of 4 $\mu$m, emitter and collector regions 16 and 17, respectively, extend from principal surface 12 approximately 1 $\mu$m into base region 13. In addition, an optional substrate contact region 18 of N+ type dopant is formed in a portion of semiconductor substrate 11 adjacent to base region 13. Preferably, emitter region 16, collector region 17, and substrate contact region 18 are formed simultaneously.

An optional base contact region 20 is formed by doping a portion of base region 13 with a P+ type dopant. Base contact region 20 is an annularly shaped region that conforms to the shape of collector region 17 such that it laterally surrounds and is spaced apart from collector region 17. Preferably, a plurality of injection suppression regions 21 are formed that extend laterally from the portion of base region 13 that is between emitter region 16 and collector region 17, through the corners of emitter region 16, and into emitter region 16. Preferably, base contact region 20 and injection suppression regions 21 are formed in the same doping step. More particularly, eight injection suppression regions 21 are formed through each corner of emitter region 16. Injection suppression regions 21 are formed by doping the portions of base region 13 and emitter region 16 with a P+ type dopant. Preferably, the concentration of the P+ type dopant forming injection suppression regions 21 is approximately $10^{20}$ atoms/cm$^3$. Although it is preferable that injection suppression regions 21 and base contact regions 20 be formed simultaneously, they may be formed sequentially wherein injection suppression regions 21 are formed either before or after base contact region 20.

Injection suppression regions 21 form eight charge carrier channels indicated by arrows 22 extending from emitter region 16 into base region 13. Each injection suppression region 21 is shaped such that the charge carrier channels indicated by arrows 22 have parallel sides 23. Sides 23 are formed from a PN junction and have a built-in potential sufficient to direct charge carrier movement parallel to sides 23. Injection suppression regions 21 extend into base region 13 to further govern the direction of charge carrier movement. When the PN junction formed between emitter region 16 and base region 13 is forward biased, charge carriers, i.e., electrons for an NPN magnetotransistor, are injected through the charge carrier channels indicated by arrows 22 and are collected by collector region 17. Thus, a large built-in potential, in conjunction with the difference in dopant concentrations between base region 13 and injection suppression regions 21, serves to suppress carrier injection through the corners of emitter region 16 and to direct the carrier flow through the charge carrier channels indicated by arrows 22. Methods of doping semiconductor substrate 11 to form base region 13, emitter region 16, collector region 17, base contact region 20, and injection suppression regions 21 are well known to those skilled in the art.

FIG. 1 further illustrates a contact and a metallization scheme designed to provide a three-dimensional (3D) magnetotransistor, i.e., a magnetotransistor capable of detecting x-directional ($B_x$), y-directional ($B_y$), and z-directional ($B_z$) components of a magnetic flux density (B). Magnetotransistor 10 has a set of four collector contacts, labeled $C_1$, $C_2$, $C_3$, and $C_4$ in FIG. 1, wherein collector contacts $C_1$ and $C_3$ detect $B_x$ and collector contacts $C_2$ and $C_4$ detect $B_y$. Collector contacts $C_1$ and $C_3$ are formed on principal surface 12 of collector region 17 such that they are across from each other on opposite sides of emitter region 16. Moreover, collector contacts $C_2$ and $C_4$ are formed on principal surface 12 of collector region 17 such that they are across from each other on opposite sides of emitter region 16. Collector contacts $C_1$ and $C_3$ are adjacent opposite sides of emitter region 16 and collector contacts $C_2$ and $C_4$ are adjacent opposite sides of collector region 16, wherein the sides adjacent collector contacts $C_1$ and $C_3$ are different than the sides adjacent collector contacts $C_2$ and $C_4$. In other words, collector contact $C_1$ is positioned 90 degrees from collector contacts $C_2$ and $C_4$, and 180 degrees from collector contact $C_3$.

Further, magnetotransistor 10 has four pairs of split-collector contacts $C_5$, $C_5'$, $C_6$, $C_6'$, $C_7$, $C_7'$, $C_8$, and $C_8'$ for detecting $B_z$. Each pair of split-collector contacts comprises two collector contacts which are formed adjacent one another on principal surface 12 of collector region 17. A first pair of split-collector contacts, comprising $C_5$ and $C_5'$, and a second pair of split-collector contacts, comprising $C_7$ and $C_7'$, are formed on principal surface 12 of collector region 17 such that they are across from each other on opposite sides of emitter region 16. A third pair of split-collector contacts, comprising $C_6$ and $C_6'$, and a fourth pair of split-collector contacts, comprising $C_8$ and $C_8'$, are formed on principal surface 12 of collector region 17 such that the third and fourth pairs of split-collector contacts are across from each other on opposite sides of emitter region 16. The first pair of split-collector contacts, $C_5$ and $C_5'$ is between collector contacts $C_1$ and $C_4$, the second pair, $C_7$ and $C_7'$, is between collector contacts $C_2$ and $C_3$, the third pair, $C_6$ and $C_6'$, is between collector contacts $C_3$ and $C_4$, and the fourth pair, $C_8$ and $C_8'$, is between collector contacts $C_1$ and $C_2$. In other words, the first pair, $C_5$ and $C_5'$, is positioned 180 degrees from the second pair, $C_7$ and $C_7'$, and the third pair, $C_6$ and $C_6'$, is positioned 180 degrees from the fourth pair, $C_8$ and $C_8'$, such that the first pair, $C_5$, $C_5'$ is bilaterally symmetric with the second pair, $C_7$, $C_7'$, and the third pair, $C_6$, $C_6'$, is bilaterally symmetric with the fourth pair, $C_8$, $C_8'$. As illustrated in FIG. 1, split collector contacts $C_5$, $C_6$, $C_7$, and $C_8$ are connected with a conductive material 31 and serve as a single collector contact $C_z$ and split collector contacts $C_5'$, $C_6'$, $C_7'$, and $C_8'$ are connected with a conductive material 32 and serve as a single collector contact $C_z'$. In other words, split-collector contacts $C_5$, $C_6$, $C_7$, and $C_8$ are electrically coupled with a conductive trace 31 and split-collector contacts $C_5'$, $C_6'$, $C_7'$, and $C_8'$ are electrically coupled with a conductive trace 32. Portions of split-collector contacts $C_5$-$C_8$ and $C_5'$-$C_8'$ which are below conductive traces 31 and 32 are shown as dashed lines.

Figure 3:
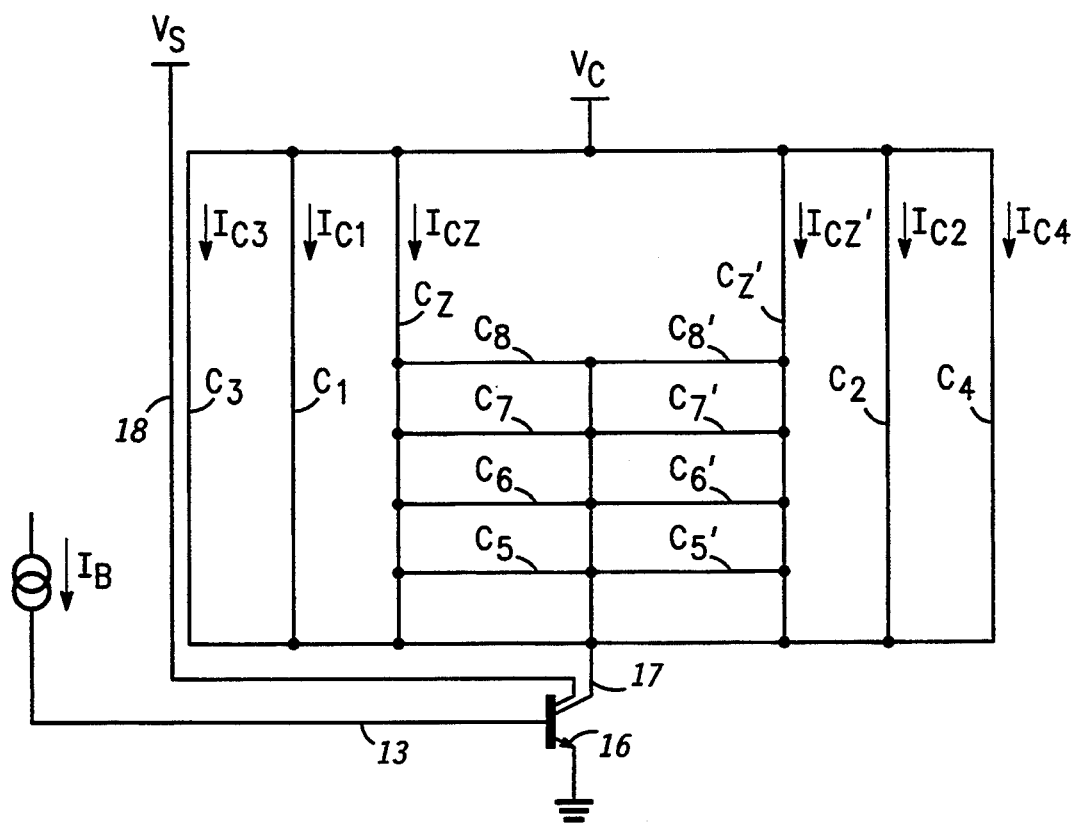
FIG. 3 is an equivalent circuit of the magnetic field sensor of FIG. 1.

Magnetotransistor 10 of FIGS. 1 and 2 is schematically illustrated in FIG. 3. An example of a bias arrangement for magnetotransistor 10 is shown wherein a constant base current $I_B$ is supplied to magnetotransistor 10 via base region 13. Each collector contact is coupled to a collector voltage $V_C$ and the substrate contact region 18 is connected to a substrate voltage $V_S$. As those skilled in the art are aware, the values of the base current $I_B$, the collector voltage $V_C$, and the substrate voltage $V_S$ determine the operating point in the forward active mode of operation. By way of example, $I_B$ is 1 milliampere (mA), $V_C$ is 5 volts, and $V_S$ is 5 volts.

In the forward active mode of operation, electrons are injected from emitter region 16 into base region 13 and collected by collector region 17. In the absence of a magnetic field, the electrons collected by collector region 17 are evenly distributed among the collector contacts because of the symmetry of magnetotransistor 10. When a magnetic field having a magnetic flux density B is applied to magnetotransistor 10, the $B_x$, $B_y$, and $B_z$ components of the magnetic flux density create an imbalance in the number of electrons collected by the collector contacts due to the action of the Lorentz force.

More particularly, $B_z$, which is perpendicular to principal surface 12 (FIG. 2), causes a deflection of electrons towards split-collector contacts $C_5$, $C_6$, $C_7$, and $C_8$ (collectively referred to as $C_z$ in FIG. 3), whereas the same component causes a deflection of electrons away from collector contacts $C_5'$, $C_6'$, $C_7'$, and $C_8'$ (collectively referred to as $C_z'$ in FIG. 3). Thus, more electrons are collected in the vicinity of split-collector contacts $C_5$, $C_6$, $C_7$, and $C_8$ than in the vicinity of split-collector contacts $C_5'$, $C_6'$, $C_7'$, and $C_8'$. Accordingly, collector current $I_{CZ}$ is greater than collector current $I_{CZ}'$. Thus, the difference between the collector currents $I_{CZ}$ and $I_{CZ}'$ is used to detect $B_z$. As those skilled in the art will recognize, collector current $I_{CZ}$ is the sum of the currents flowing through split-collector contacts, $C_5$, $C_6$, $C_7$, and $C_8$, whereas collector current $I_{CZ}'$ is the sum of the currents flowing through split-collector contacts $C_5'$, $C_6'$, $C_7'$, and $C_8'$.

The $B_x$ component, which is parallel to principal surface 12 and oriented in the x-direction, causes a deflection of electrons flowing in the y-direction i.e., electrons flowing towards collector contacts $C_1$ and $C_3$ of FIG. 1. Thus, $B_x$ causes a deflection of electrons towards collector contact $C_1$ and away from collector contact $C_3$. Accordingly, the collector current shown in FIG. 3 as $I_{C1}$ is greater than the collector current $I_{C3}$ in the presence of $B_y$. Although $B_y$ is also parallel to principal surface 12, it is oriented in the y-direction. Thus, $B_y$ causes a deflection of electrons flowing in the x-direction, i.e., electrons flowing towards collector contacts $C_2$ and $C_4$, such that the collector current $I_{C4}$ is greater than collector current $I_{C2}$. In other words, the charge carriers collected by collector contacts $C_1$ and $C_3$ are differentially deflected by the $B_x$ component of the magnetic flux density, whereas the charge carriers collected by collector contacts $C_2$ and $C_4$ are differentially deflected by the $B_y$ component of the magnetic flux density. Thus, the $B_x$ component deflects the charge carriers away from collector contact $C_1$ and towards collector contact $C_3$, whereas the $B_y$ component deflects the charge carriers away from collector contact $C_2$ and towards collector contact $C_4$. Therefore, the difference in collector currents $I_{C1}$ and $I_{C3}$ may be used to detect $B_x$, whereas the difference in collector currents $I_{C4}$ and $I_{C2}$ may be used to detect $B_y$.

In addition, there are x-directional velocity vector components, $V_x$, and y-directional velocity vector components, $V_y$, which result from the "off-axis" positioning of the split-collectors. These velocity vector components, in conjunction with $B_x$ and $B_y$, introduce a cross sensitivity in the flow of electrons from emitter region 16 to the split-collector contacts. More particularly, $B_x$ lowers the number of electrons collected by split-collector contacts $C_5$ and $C_5'$ as well as by split collector contacts $C_6$ and $C_6'$ while increasing the number of electrons collected by split-collector contacts $C_7$ and $C_7'$ and by split-collector contacts $C_8$ and $C_8'$. Since split-collector contacts $C_5$, $C_6$, $C_7$, and $C_8$ are connected, there is no net change in collector current $I_{CZ}$ due to $B_x$. Similarly, since split-collector contacts $C_5'$, $C_6'$, $C_7'$, and $C_8'$ are coupled together, there is no net change in collector current $I_{C3}'$ due to $B_x$. In like fashion, there is no net change in collector current $I_{CZ}$ and $I_{CZ}'$ due to $B_y$.

Figure 4:
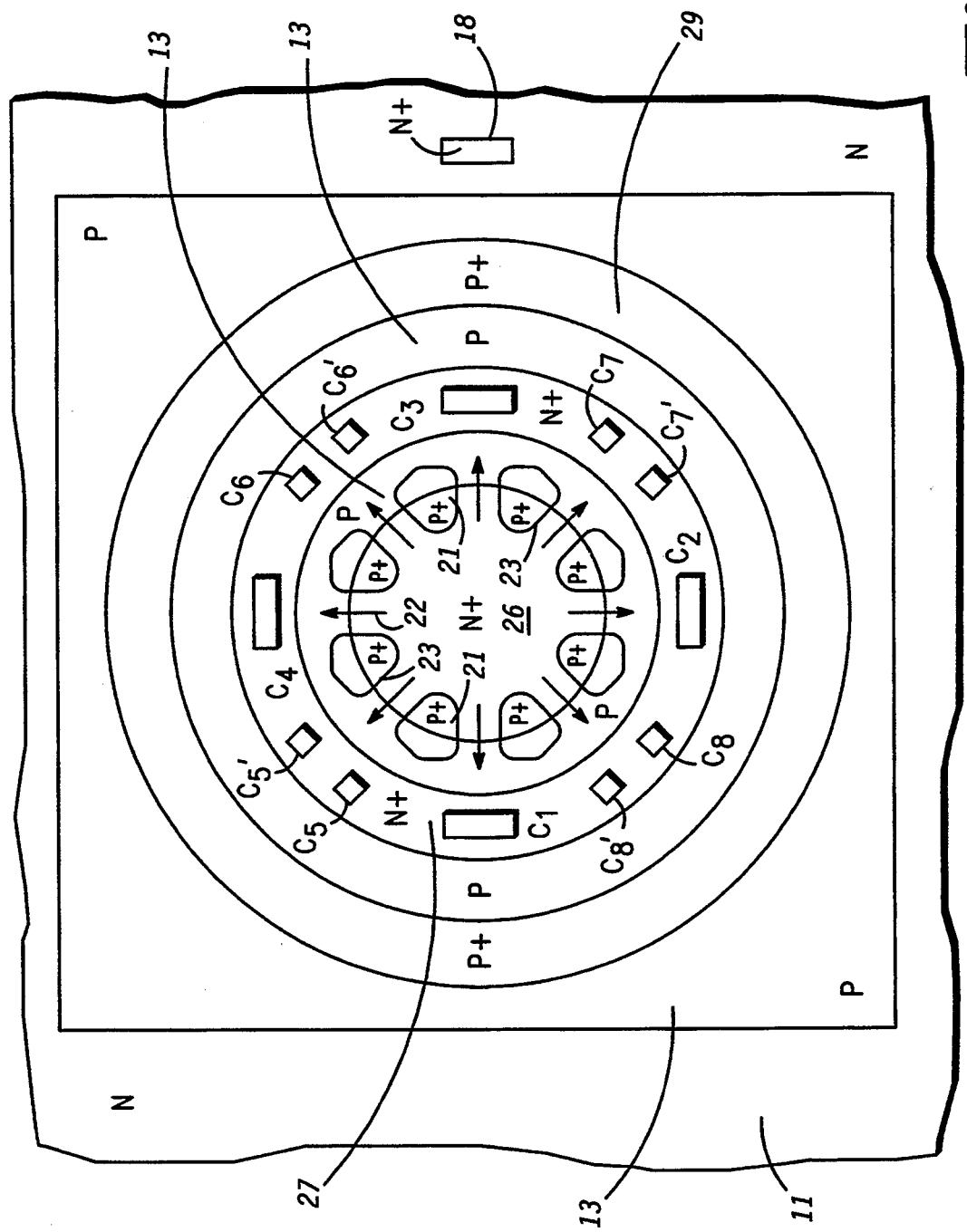
FIG. 4 illustrates a highly-enlarged plan view of a second embodiment of a portion of a three-dimensional magnetic field sensor in accordance with the present invention.

FIG. 4 illustrates a highly-enlarged plan view of a second embodiment of a magnetic field sensor 25. Reference numerals for FIG. 4 corresponding to like elements of FIG. 1 have been retained. For clarity, conductive traces 31 and 32 have been omitted from FIG. 4. Although both FIGS. 1 and 4 have emitter, collector, and base contact regions, different reference numerals have been attached to these elements since they have different shapes in FIGS. 1 and 4. In the second embodiment, emitter region 26 is a circular $N^+$ region having a dopant concentration of, for example, $10^{20}$ atoms/cm$^3$. Collector region 27 is a circular shaped $N^+$ region that conforms to the shape of emitter region 26, and laterally surrounds and is spaced apart from emitter region 26. Collector region 27 is formed within base region 13 by doping a second portion of base region 13 with the N type dopant having a concentration of $10^{20}$ atoms/cm$^3$. A base contact region 29 is formed by doping a portion of base region 13 with a $P^+$ type dopant. Base contact region 29 is circular in shape, conforming to the shape of collector region 27, and laterally surrounds and is spaced apart from collector region 27.

Although, the embodiments shown in FIGS. 1 and 4 illustrate four sets of split-collector contacts, it shall be understood that the present invention may be implemented using two sets of split-collector contacts, wherein the two sets of split-collector contacts are on opposite sides of emitter regions 16 or 26. When using only two sets of split-collector contacts, it may be desirable to form the emitter suppression regions on the sides without the split-collector contacts such that the emitter suppression regions extend along the entire side of the emitter regions without the split-collector contacts. By way of example, for an embodiment such as that shown in FIG. 1 wherein only split-collector contacts $C_5$, $C_5'$, $C_7$, and $C_7'$, are present, the injection suppression regions between single collector contacts $C_3$ and $C_4$ would touch forming a single injection suppression region and the injection suppression regions between single collector contacts $C_1$ and $C_2$ would touch forming a single collector contact.

Figure 5:
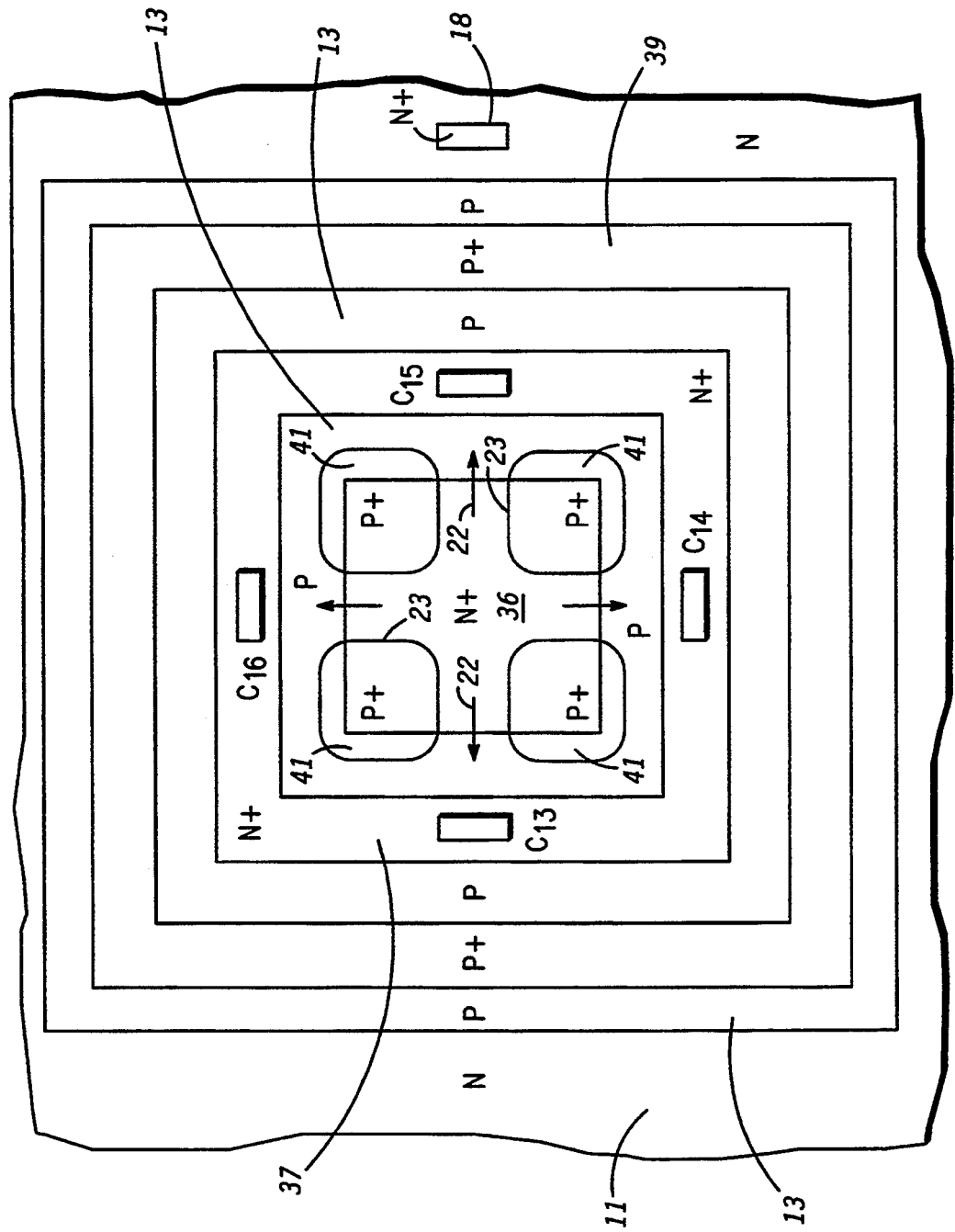
FIG. 5 illustrates a plan view of an embodiment of a two-dimensional magnetic field sensor in accordance with the present invention.

FIG. 5 illustrates a plan view of an embodiment of a two dimensional (2D) magnetic field sensor 30 in accordance with the present invention. Reference numerals for FIG. 5 corresponding to like elements of FIG. 1 have been retained. For clarity, conductive traces 31 and 32 have been omitted from FIG. 5. Similar to the embodiment of FIG. 1, 2D magnetic field sensor 30 comprises a semiconductor substrate 11 and a base region 13 disposed therein. Further, magnetic field sensor 30 has an emitter region 36 formed within base region 13, wherein emitter region 36 has a rectangular shape having four sides and four corners. Emitter region 36 is an N+ region having, for example, a dopant concentration of $10^{20}$ atoms/cm$^3$. A second portion of base region 13 is doped with the N type dopant to form an N+ collector region 37 that conforms to the shape of emitter region 36 and laterally surrounds and is spaced apart from emitter region 36. A substrate contact region 18 of N+ type dopant is formed in a portion of semiconductor substrate 11 adjacent to base region 13. By way of example, collector region 37 and substrate contact region 18 have concentrations of $10^{20}$ atoms/cm$^3$.

An optional base contact region 39 is formed by doping a portion of base region 13 with a P+ type dopant. Base contact region 20 is a rectangular shaped region that conforms to the shape of collector region 37, and laterally surrounds and is spaced apart from collector region 37. In addition, four injection suppression regions 41 are formed through each corner of emitter region 36 by doping the portions of base region 13 and emitter region 36 with a P+ type dopant. Preferably, the concentration of P+ type dopant is $10^{20}$ atoms/cm$^3$. As those skilled in the art are aware, metal contacts (not shown) are formed such that an emitter contact, a base contact, collector contacts are formed. Preferably, four collector contacts, $C_{13}$-$C_{16}$, are formed on principal surface 12 in collector contact region 37, wherein one collector contact is formed on each side of emitter region 36 such that the collector contacts are bilaterally symmetric about emitter region 36. It shall be understood that 2D magnetic field sensor 30 is a bilaterally symmetric device.

In a forward active mode of operation, a constant current is applied to base contact region 39, a constant voltage is applied to each collector contact $C_{13}$-$C_{16}$, and a constant voltage is applied to substrate contact region 18. In this mode of operation, electrons are emitted from emitter region 36 into base region 13 and collected by collector region 37. In the absence of a magnetic field, the number of electrons collected by collector region 37 are evenly distributed among collector contacts $C_{13}$-$C_{16}$ because of the symmetry of magnetotransistor 30. When a magnetic flux density comprising a $B_x$ and a $B_y$ component is applied to magnetotransistor 30, the $B_x$ and $B_y$ components create an imbalance in the number of electrons collected by the collector contacts due to the action of the Lorentz force. More particularly, the $B_x$ component deflects electron flow such that the number of electrons collected by collector contact $C_{15}$ increases and the number of electrons collected by collector contact $C_{13}$ decreases. The $B_y$ component, on the other hand, increases the number of electrons collected by collector contact $C_{16}$ and decreases the number of electrons collected by collector contact $C_{14}$. Thus, a difference in the collector current between collector contacts $C_{13}$ and $C_{15}$ is used to detect $B_x$, and the difference in the collector currents between collector contacts $C_{14}$ and $C_{16}$ is used to detect $B_y$.

By now it should be appreciated that the present invention discloses a collector arrangement for a magnetotransistor and method of making said magnetotransistor. In the present invention, a collector region is formed such that it is a continuous structure, extending from the principal surface into the base region. Further, the collector region surrounds and is spaced apart from the emitter region. A plurality of collector contacts are formed in the collector region, wherein the collector contacts are symmetrically distributed around the emitter region.

In the 3D magnetotransistor embodiment, the collector contacts include split-collector contacts (collector contacts $C_5$-$C_8$ and $C_5'$-$C_8'$), whereas split-collector contacts are absent from the 2D embodiment. In the present invention all sources of noise, i.e., emitter, base, collector-base junction, etc. have impacted upon the charge carriers by the time they reach the collector region. Thus, splitting the charge carriers between the collector contacts correlates the noise within the collector region thereby eliminating noise related distortion.

Further, cross sensitivity in the 3D magnetotransistor embodiment is eliminated by placing at least two pairs of split-collector contacts across from each other on opposite sides of the emitter region such that the at least two pairs of split-collector contacts are between the x and y axes. A first of the pair of split-collector contacts on one side of the emitter region is electrically coupled to a first of the pair of split-collector contacts on the opposite side of the emitter region, and a second of the pair of split-collector contacts on the one side of the emitter region is electrically coupled to a second of the pair of split-collector contacts on the opposite side of the emitter region. Under the influence of a magnetic flux density, the number of charge carriers arriving in the vicinity of a collector contact, i.e., the collector current, is increased in the collector contacts on the one side of the emitter region and decreased in the collector contacts on the opposite side of the emitter region. Accordingly, the net change in collector current in the coupled contacts is zero, hence the cross-sensitivity is also zero. In other words, the $B_x$ and $B_y$ components of the magnetic flux density do not change the total number of charge carriers collected by the collector region.

I claim:

1. A method of forming a semiconductor magnetic field sensor, comprising the steps of:

providing a semiconductor substrate of a first conductivity type, the semiconductor substrate having a principal surface;

forming a base region of a second conductivity type in the semiconductor substrate, the base region extending from the principal surface into the semiconductor substrate;

forming an emitter region of the first conductivity type in the base region, the emitter region extending from the principal surface into the base region;

forming a collector region of the first conductivity type in the base region, the collector region being a continuous structure that is spaced apart from and laterally surrounds the emitter region;

providing an electrical contact to the base region;

providing an electrical contact to the emitter region; and providing a plurality of collector contacts to the collector region, wherein a current flowing into some of the plurality of collector contacts is changed by a first component of a magnetic flux density, and the current flowing into others of the plurality of collector contacts is changed by a second component of the magnetic flux density.

2. A method of forming a semiconductor magnetic field sensor as claimed in claim 1, further comprising the steps of:

forming the emitter region in an octagonal shape, the emitter region having eight sides and eight corners;

forming a base contact region, the base contact region spaced apart from and laterally surrounding the emitter region;

forming a plurality of injection suppression regions, the plurality of injection suppression regions extending into the emitter region to form a plurality of conduction channels through which charge carriers flow; and providing at least one collector contact in the collector region adjacent each side of the emitter region, wherein a current flowing into at least two of the collector contacts is changed by a third component of the magnetic flux density.

3. A method of forming a semiconductor magnetic field sensor as claimed in claim 1, further comprising the steps of:

providing a substrate contact region in the semiconductor substrate region of the first conductivity type; and providing a substrate contact to the substrate contact region.

4. A method of forming a semiconductor magnetic field sensor as claimed in claim 1, further comprising the steps of:

forming the emitter region in a circular shape;

forming a base contact region, the base contact region spaced apart from and laterally surrounding the emitter region;

forming an injection suppression region, the injection suppression region extending into the emitter region to form a plurality of conduction channels through which charge carriers flow; and providing at least eight collector contacts in the collector region adjacent the emitter region, wherein a first collector contact is positioned 90 degrees from a second collector contact and a fourth collector contact, and the first collector contact is positioned 180 degrees from a third collector contact, and a first pair of split-collector contacts is positioned 180 degrees from a second pair of split-collector contacts and the current flowing into the first and the third collector contacts is changed by the first directional component of the magnetic flux density, the current flowing into the second and the fourth collector contacts is changed by the second directional component of the magnetic flux density, and a current flowing into the first and second pairs of split-collector contacts is changed by a third directional component of the magnetic flux density.

5. A method of forming a semiconductor magnetic field sensor as claimed in claim 4, wherein the step of providing at least eight collector contacts in the collector region adjacent the emitter region includes coupling a first split-collector contact of the first pair of split-collector contacts with a first split-collector contact of the second pair of split-collector contacts and coupling a second split-collector contact of the first pair of split-collector contacts with a second split-collector contact of the second pair of split-collector contacts.

6. A method for sensing a directional component of a magnetic flux density, comprising the steps of:

providing a transistor having an emitter region of a first conductivity type, a base region of a second conductivity type, and a continuous collector region of the first conductivity type, wherein the emitter and the collector regions are formed within the base region and the collector region surrounds and is spaced apart from the emitter region;

forming a plurality of collector contacts which contact the collector region, wherein a first and a second of the plurality of collector contacts are adjacent opposite sides of the emitter region and a third and a fourth of the plurality of collector contacts are adjacent opposite sides of the emitter region;

applying a magnetic field to the transistor;

injecting charge carriers from the emitter region through the base region; and collecting the charge carriers in the collector region, including collecting a first portion of the charge carriers via the first collector contact, collecting a second portion of the charge carriers via the second collector contact, collecting a third portion of the charge carriers via the third collector contact, and collecting a fourth portion of the charge carriers via the fourth collector contact, the first and second portions having a different number of charge carriers in the presence of a first directional component of a magnetic flux density and the third and fourth portions having a different number of charge carriers in the presence of a second directional component of the magnetic flux density.

7. The method of claim 6, wherein the step of providing a transistor further comprises forming a plurality of injection suppression regions which extend into portions of the emitter region.

8. The method of claim 7, wherein the step of providing a transistor includes forming circular shaped emitter and collector regions.

9. The method of claim 7, wherein the step of forming a plurality of injection suppression regions includes doping the portions of the emitter region with an impurity material of the second conductivity type.

10. The method of claim 9, wherein the step of providing a transistor includes forming rectangular shaped emitter and collector regions, the emitter region having a plurality of corners, and wherein the step of forming a plurality of injection suppression regions includes forming one of the plurality of injection suppression regions in each of the plurality of corners.

11. The method of claim 6, wherein the step of providing a transistor includes forming octagonal shaped emitter and collector regions having first and second split-collector contacts adjacent a first side of the emitter region and third and fourth split-collector contacts adjacent a second side of the emitter region, and the step of collecting the charge carriers in the collector region includes collecting first and second subportions of a fifth portion of the charge carriers via the first and third split-collector contacts, respectively, collecting first and second subportions of a sixth portion of the charge carriers via the second and fourth split-collector contacts, respectively, the fifth and sixth portions having a different number of charge carriers in the presence of a third directional component of the magnetic flux density.

12. The method of claim 11, wherein the step of providing a transistor includes forming fifth and sixth split-collector contacts adjacent a third side of the emitter region and forming seventh and eighth split-collector contacts adjacent a fourth side of the emitter region, and the step of collecting the charge carriers further includes collecting third and fourth subportions of the fifth portion of the charge carriers via the fifth and seventh split-collector contacts, respectively, and the step of collecting the charge carriers further includes collecting third and fourth subportions of the sixth portion of the charge carriers via the sixth and eighth split-collector contacts, respectively.

13. The method of claim 11, wherein the step of providing a transistor includes electrically coupling the first, third, fifth, and seventh split-collector contacts and electrically coupling the second, fourth, sixth, and eighth split-collector contacts.

14. A method for sensing a directional component of a magnetic flux density, comprising the steps of:
providing a semiconductor substrate comprising a base region of a first conductivity type, the base region having a base contact region and containing a continuous collector region of a second conductivity type, the continuous collector region surrounding and spaced apart from an emitter region of the second conductivity type;
forming a plurality of collector contacts in contact with the continuous collector region;
forming at least one conduction channel for transporting charge carriers to at least one of the plurality of collector contacts; and
injecting charge carriers from the emitter region, through the at least one conduction region, to the continuous collector region, a first portion of the charge carriers collected at a first collector contact of the plurality of collector contacts, a second portion of the charge carriers collected at a second collector contact of the plurality of collector contacts, a third portion of the charge carriers collected at a third collector contact of the plurality of collector contacts, and a fourth portion of the charge carriers collected at a fourth collector contact of the plurality of collector contacts, the first and second portions being of different amounts in the presence of a first directional component of a magnetic flux density, and the third and fourth portions being of different amounts in the presence of a second directional component of the magnetic flux density.

15. The method of claim 14, wherein the step of injecting charge carriers from the emitter region, through the at least one conduction region, to the continuous collector region further comprises applying constant current to the base contact region, applying a constant voltage to the plurality of collector contacts in the collector region, and applying a constant voltage to a substrate contact region.

16. The method of claim 14, wherein the step of forming a plurality of collector contacts in contact with the collector region includes forming the plurality of collector contacts symmetrically distributed on the continuous collector region.

17. The method of claim 16, wherein the step of forming at least one conduction channel includes forming four conduction channels, a first conduction channel for transporting charge carriers to the first collector contact, a second conduction channel for transporting charge carriers to the second collector contact, a third conduction channel for transporting charge carriers to the third collector contact, and a fourth conduction channel for transporting charge carriers to the fourth collector contact.

18. The method of claim 14, wherein the step of injecting charge carriers further includes collecting a first subportion of a fifth portion of the charge carriers at a first split-collector contact of a first set of split-collector contacts, collecting a second subportion of the fifth portion of the charge carriers at a first split-collector contact of a second set of split-collector contacts, collecting a first subportion of a sixth portion of the charge carriers at a second split-collector contact of the first set of split-collector contacts, and collecting a second subportion of the sixth portion of the charge carriers at a second split-collector contact of the second set of split-collector contacts, the fifth and sixth portions being of different amounts in the presence of a third directional component of the magnetic flux density.

19. The method of claim 18 wherein the step of forming a plurality of collector contacts in-contact with the collector region includes forming four collector contacts symmetrically distributed on the continuous collector region and further includes forming third and fourth sets of split-collector contacts, the first, second, third, and fourth sets of split-collector contacts symmetrically distributed on the continuous collector region.

20. The method of claim 19, wherein the step of forming at least one conduction channel includes forming eight conduction channels, a first conduction channel for transporting charge carriers to the first collector contact, a second conduction channel for transporting charge carriers to the second collector contact, a third conduction channel for transporting charge carriers to the third collector contact, a fourth conduction channel for transporting charge carriers to the fourth collector contact, a fifth conductive channel for transporting charge carriers to ,the first set of split-collector contacts, a sixth conductive channel for transporting charge carriers to the second set of split-collector contacts, a seventh conductive channel for transporting charge carriers to the third set of split-collector contacts, and an eighth conductive channel for transporting charge carriers to the fourth set of split-collector contacts.

* * * * *